US010605831B2

(12) United States Patent
Beauregard et al.

(10) Patent No.: US 10,605,831 B2
(45) Date of Patent: Mar. 31, 2020

(54) TOOL FOR AUTOMATICALLY REPLACING DEFECTIVE POGO PINS (71) Applicant: International Business Machines Corporation, Armonk, NY (US)

(72) Inventors: Vincent Beauregard, Granby (CA); Styve Giard, Granby (CA); Gilles Labbe, Waterloo (CA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 232 days.

(21) Appl. No.: 15/725,515

(22) Filed: Oct. 5, 2017

(65) Prior Publication Data

US 2019/0107560 A1   Apr. 11, 2019

(51) Int. Cl.
G01R 3/00 (2006.01)
G01R 1/067 (2006.01)
G01R 1/073 (2006.01)
G01R 31/28 (2006.01)

(52) U.S. Cl.
CPC .......... G01R 3/00 (2013.01); G01R 1/06722 (2013.01); G01R 1/07392 (2013.01); G01R 31/2834 (2013.01)

(58) Field of Classification Search
CPC .......................... G01R 31/26; G01R 31/2601; G01R 1/06722; G01R 1/07392; G01R 3/00; G01R 31/2834
See application file for complete search history.

(56) References Cited

U.S. PATENT DOCUMENTS

| 6,501,289 B1 | 12/2002 | Takekoshi |
| 7,154,284 B2 | 12/2006 | Fan |
| 7,268,571 B1 | 9/2007 | Korson et al. |
| 7,477,062 B2 | 1/2009 | Kinoshita |
| 8,237,460 B1 | 8/2012 | Park et al. |

(Continued)

FOREIGN PATENT DOCUMENTS

| JP | S63244640 A | * 10/1988 |
| JP | 63244640 A | 9/2015 |
| TW | 200624818 A | 7/2006 |

OTHER PUBLICATIONS

List of IBM Patents or Patent Application Treated as related (Appendix P); Filed Oct. 5, 2017, 2 pages.

(Continued)

Primary Examiner — Carl J Arbes
(74) Attorney, Agent, or Firm — Cantor Colburn LLP (57) ABSTRACT Embodiments of the invention include a tool and method for automatically replacing defective pogo pins for use in testing a semiconductor package. Aspects of the invention include a nozzle tip and a pin management valve assembly coupled to the nozzle tip. The pin management valve assembly is actuatable to couple an open pin management valve or a partially closed pin management valve to the nozzle tip. The open pin management valve includes a first diameter and the partially closed pin management valve includes a second diameter. A vacuum reservoir is coupled to the pin management valve assembly and a vacuum management valve is positioned between the pin management valve assembly and the vacuum reservoir. The vacuum management valve is actuatable between an open and closed position.

17 Claims, 9 Drawing Sheets (56) References Cited

U.S. PATENT DOCUMENTS

| | | |
|---|---|---|
| 9,121,901 B2 | 9/2015 | Kiyokawa |
| 2008/0061809 A1 | 3/2008 | Lee et al. |
| 2009/0039908 A1 | 2/2009 | Ikeuchi |
| 2015/0130489 A1 | 5/2015 | Yamada |

OTHER PUBLICATIONS

Vincent Beauregard, et al. "Tool for Automatically Replacing Defective Pogo Pins," U.S. Appl. No. 15/798,706, filed Oct. 31, 2017.
Anonymous "Pogo Pin Pickup Device," An IP.com Prior Art Database Technical Disclosure, Electronic Publication Date Sep. 24, 2014, IP.com No. IPCOM000238910D, 3 pages.

\* cited by examiner

TOOL FOR AUTOMATICALLY REPLACING DEFECTIVE POGO PINS

BACKGROUND

The present invention generally relates to equipment for testing semiconductor devices, and more specifically, to a tool and method for automatically replacing defective pogo pins for use in testing a semiconductor package.

In the semiconductor industry, integrated circuits (ICs) are typically tested in wafer form prior to being packaged. That is, a wafer comprising a multitude of ICs is tested prior to dicing the wafer into individual chips. During this testing, the integrated circuits are individually tested on a wafer, and appropriate action is taken if the testing indicates that predetermined specifications are not met. After dicing, the individual chips are then packaged into a multitude of semiconductor packages, wherein the integrated circuits are electrically coupled to electrical contacts, such as for subsequent attachment to a printed circuit board (PCB). Once the chips are packaged, each semiconductor package is again tested, and appropriate action is again taken if predetermined electrical specifications are not met.

Conventionally, manufactured semiconductor packages are tested in automatic test equipment (ATE). A semiconductor package is inserted into a contactor of the ATE and electrical contacts of the semiconductor package contact and depress a plurality of spring-biased contactor pins, also called "pogo" pins. The pogo pins of the contactor generally provide a temporary electrical connection between the electrical contacts of the semiconductor package and a test PCB or test board. The test board, in conjunction with the contactor, is configured to electrically test the circuits of the circuit board prior to final assembly of the semiconductor package on a PCB.

SUMMARY

Embodiments of the present invention are directed to a tool for automatically replacing defective pogo pins for use in testing a semiconductor package. A non-limiting example of the tool includes a nozzle tip and a pin management valve assembly coupled to the nozzle tip. The pin management valve assembly is actuatable to couple an open pin management valve or a partially closed pin management valve to the nozzle tip. The open pin management valve includes a first diameter and the partially closed pin management valve includes a second diameter. A vacuum reservoir is coupled to the pin management valve assembly and a vacuum management valve is positioned between the pin management valve assembly and the vacuum reservoir. The vacuum management valve is actuatable between an open and closed position.

Embodiments of the present invention are directed to a method for removing a pogo pin from a substrate. A non-limiting example of the method includes providing a tool operable to manipulate pogo pins. The tool includes a nozzle tip and a pin management valve assembly coupled to the nozzle tip. The pin management valve assembly is actuatable to couple an open pin management valve or a partially closed pin management valve to the nozzle tip. The open pin management valve includes a first diameter and the partially closed pin management valve includes a second diameter. The tool also includes a vacuum reservoir coupled to the pin management valve assembly and a vacuum management valve positioned between the pin management valve assembly and the vacuum reservoir. The vacuum management valve is actuatable between an open and closed position. The method includes positioning the pogo pin under the nozzle tip and actuating the pin management valve assembly to couple the open pin management valve to the nozzle tip. The method includes actuating the vacuum management valve to the open position.

Embodiments of the present invention are directed to a method for manipulating a pogo pin. A non-limiting example of the method includes providing a tool operable to manipulate pogo pins. The tool includes a nozzle tip and a pin management valve assembly coupled to the nozzle tip. The pin management valve assembly is actuatable to couple an open pin management valve or a partially closed pin management valve to the nozzle tip. The open pin management valve includes a first diameter and the partially closed pin management valve includes a second diameter. The tool also includes a vacuum reservoir coupled to the pin management valve assembly and a vacuum management valve positioned between the pin management valve assembly and the vacuum reservoir. The vacuum management valve is actuatable between an open and closed position. The method includes positioning the pogo pin under the nozzle tip and actuating the pin management valve assembly to couple the partially closed pin management valve to the nozzle tip. The method includes actuating the vacuum management valve to the open position to pull the pogo pin into the partially closed pin management valve.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

The present invention is directed towards equipment and methods for testing, validating, and monitoring semiconductor devices. More particularly the present invention provides a tool and method for automatically replacing defective pogo pins used in the testing of semiconductor packages. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, manufactured semiconductor packages are tested in automatic test equipment (ATE). To test a particular semiconductor package, the package is inserted into a contactor having a plurality of spring-biased pogo pins. The pins provide a temporary electrical connection between electrical contacts of the semiconductor package and a test PCB or test board. In this manner circuits in the semiconductor package can be tested.

One common problem with conventional contactors is that the pogo pins are generally considered a "wear item" of the contactor. Individual pogo pins become faulty due to wear, contamination, bending, oxidation, or various other reasons. Faulty pogo pins, and thus faulty contactors, can result in continuity problems between the test board and the semiconductor package to be tested, as well as potentially lost yield if the test apparatus is not monitored properly. To prevent such problems, the pogo pins are typically replaced throughout the operational life of the contactor.

With some generality, two conventional solutions exist for replacing these contactor pogo pins. The first option is to replace all of the pogo pins at the same time. Once new pins are inserted into the contactor an estimated wear period is determined for the next replacement cycle. The wear period is calculated based on the anticipated wear cycle of the pins and includes any desired tolerance. After the wear period elapses the pins are wholesale replaced and the wear period restarts. This approach advantageously simplifies the actual replacement process and is well-suited to automated or semi-automatic systems. A disadvantage of this approach is the indiscriminate replacement of many working pins, significantly increasing costs.

The second option is to monitor and replace only faulty pogo pins. This approach ensures that working pins are not wasted, but typically requires that nonworking pins be manually replaced. Changing individual faulty contactor pogo pins can be challenging. Typical pogo pins have a very small diameter (e.g., equal or less than about 0.020 inches). Complicating replacement further is the fact that these small pins are packed tightly into large arrays of pins. For example, conventional pin arrays can have as many as 8,000 pins at a pitch of about 0.5 mm. Moreover, the diameter and pitch of these pins continues to shrink even further to keep up with decreasing semiconductor device critical dimensions.

Turning now to an overview of aspects of the present invention, one or more embodiments of the invention provide a tool and method for manipulating pogo pins for use in testing a semiconductor package. The tool includes pin management valves and vacuum management valves that can be pneumatically actuated between various configurations. In this manner, a single multifunction tool is provided that is able to remove a defective pogo pin and discard it and, with the same nozzle and with simple valve actuation, pick up a new pogo pin of the same type, store the pogo pin temporarily, and insert it where the pogo pin needs to be installed.

Figure 1:
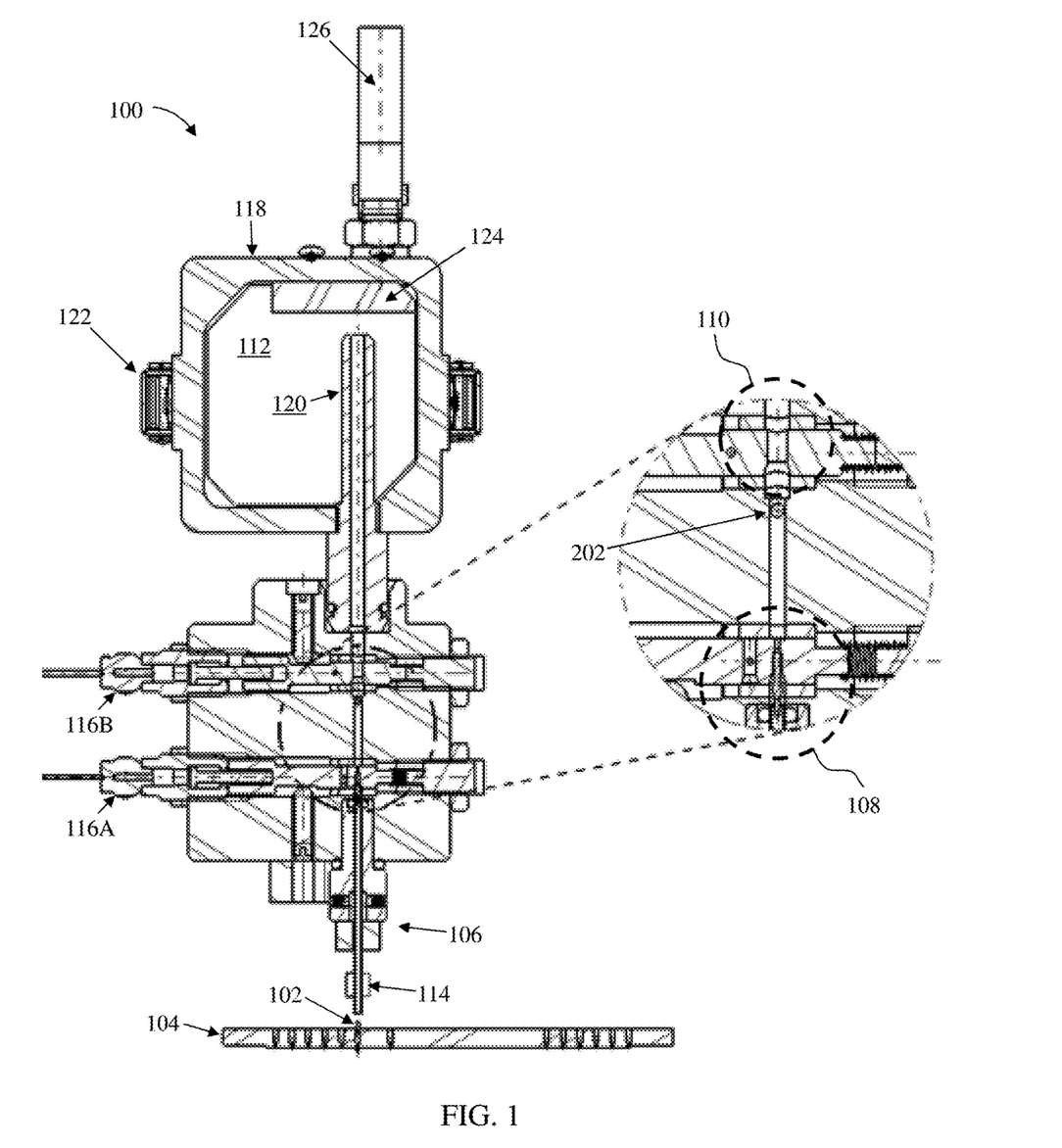
FIG. 1 depicts a cross-sectional view of a tool for manipulating pogo pins according to one or more embodiments of the present invention.

Turning now to a more detailed description of aspects of the present invention, FIG. 1 depicts a cross-sectional view of a tool 100 for manipulating a pogo pin 102 in a substrate 104 according to one or more embodiments of the invention. In some embodiments of the present invention, the substrate 104 is an interposer having one or more defective pogo pins. In some embodiments of the present invention, the substrate 104 is a pin bank having one or more new pogo pins. The pogo pin 102 can be a conventional pogo pin having a diameter of about 0.010 to 0.030 inches. In some embodiments of the present invention, the pogo pin 102 has a diameter of about 0.020 inches. In some embodiments of the present invention, the pogo pin 102 is vertically placed in an array of pogo pins in the substrate 104. In some embodiments of the present invention, the pogo pin array includes more than 1,000 pogo pins at a pitch of about 0.2 to 2 mm. For example, the pogo pin array can include about 8,000 pins at a pitch of about 0.5 mm. In some embodiments of the present invention, the tool 100 includes a nozzle assembly 106, a pin management valve assembly 108, a vacuum management valve assembly 110, and a vacuum reservoir 112.

The nozzle assembly 106 includes a housing, nozzle tip, and tubing of a sufficiently large outer diameter to allow a single pogo pin to pass through. In some embodiments of the present invention, the outer diameter of the nozzle tip and tubing is about 10, 15, 20, 25, 40, 50, 75, 100, 125, 150 or 200 percent larger than the diameter of the pogo pins, depending on the pitch of the pogo pins in the substrate 104. In some embodiments of the present invention, the nozzle tip and tubing has an outer diameter of about 0.4 mm, although other sizes are within the contemplated scope of the invention. In some embodiments of the present invention, the inner diameter of the nozzle tip and tubing are sized based on the diameter of the substrate 104 pogo pin hole and the shape of the pogo pin 102. For example, if the substrate 104 hole diameter is close to the pogo pin 102 diameter (i.e., within 2, 5, 10 percent), then the nozzle tip inner diameter should be substantially equal to the diameter of the pogo pin 102 (i.e., within 5 percent). The shape of the pogo pin 102 will also influence the entry of the pogo pin 102 into the substrate 104 hole. For example, if there is a bevel on the pogo pin 102 then insertion into the substrate 104 hole is easier and the inner diameter of the nozzle tip can be increased. Conversely, if the shape of the pogo pin 102 is square, the inner diameter of the nozzle tip needs to be substantially equal (i.e., within 5 percent) to the pogo pin 102 diameter to ensure alignment with the center of the substrate 104 hole. In some embodiments of the present invention, the nozzle assembly 106 also includes side pin blockers 114 which prevent the tool 100 from inadvertently manipulating pogo pins adjacent to the pogo pin 102.

Figure 3:
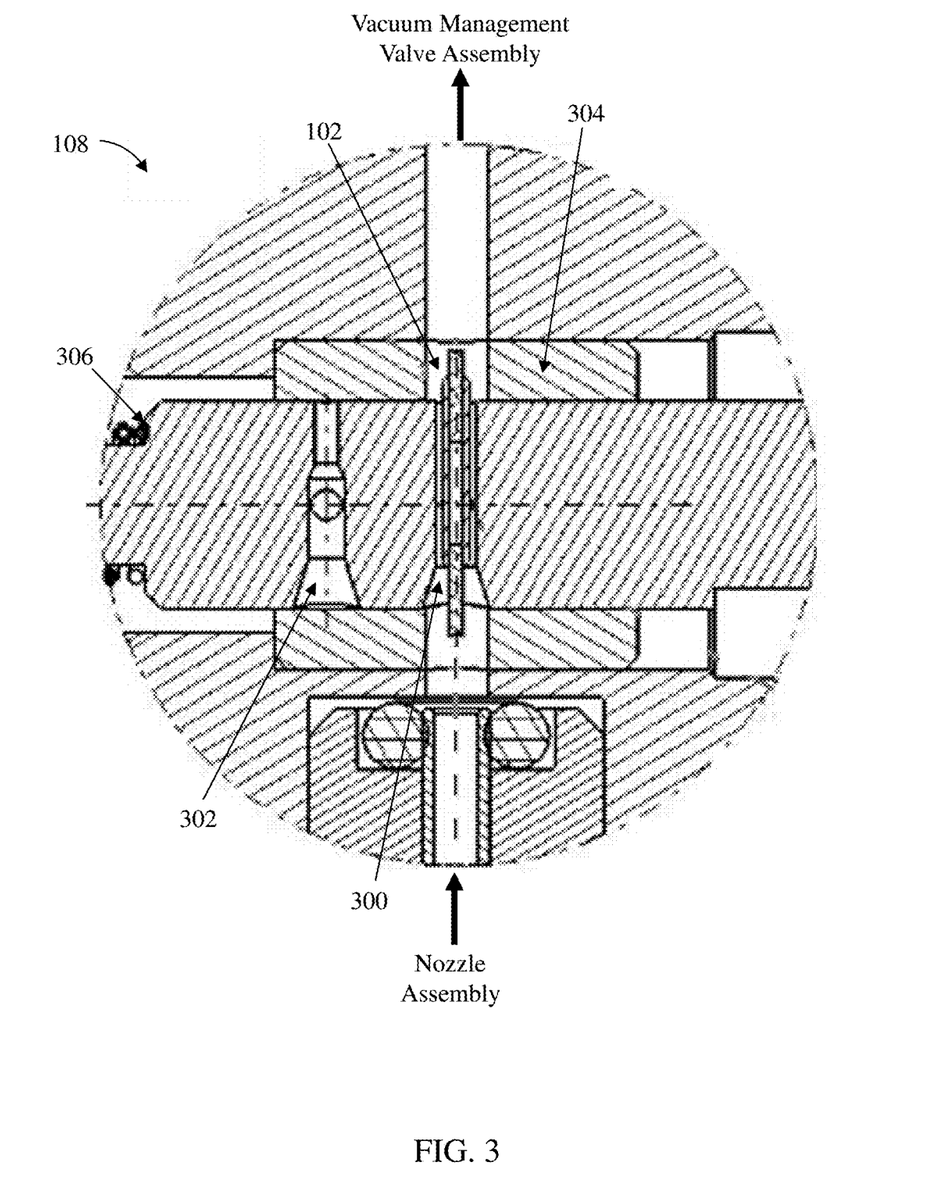
FIG. 3 depicts a blown-up cross-sectional view of a pin management valve assembly in an open position according to one or more embodiments of the invention.
Figure 4:
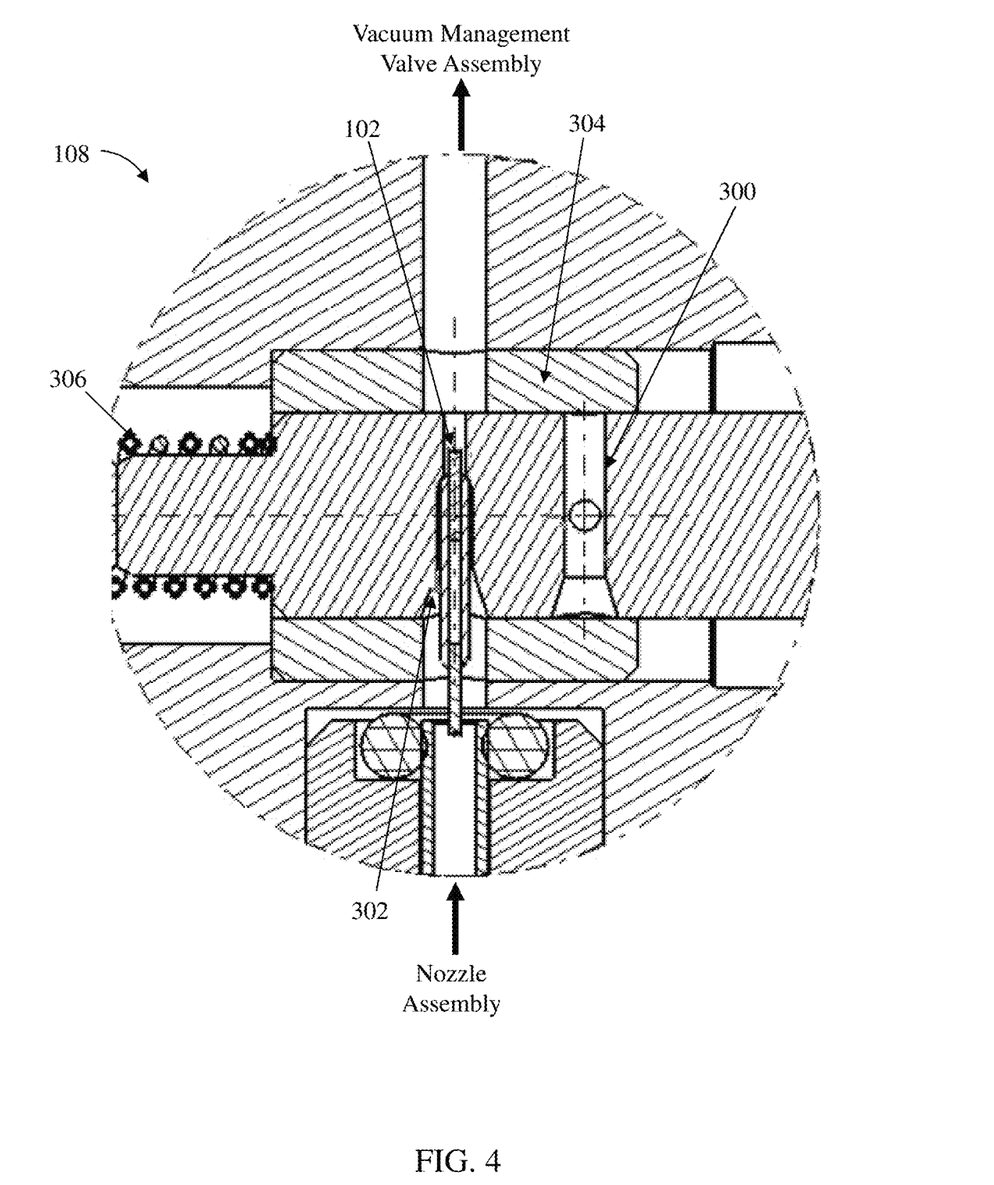
FIG. 4 depicts a blown-up cross-sectional view of the pin management valve assembly in a partially closed according to one or more embodiments of the invention.

The nozzle assembly 106 is coupled to the pin management valve assembly 108 such that the pogo pin 102 can pass through the nozzle assembly 106 and into the pin management valve assembly 108. The pin management valve assembly 108 can be actuated between an open valve position and a partially closed valve position by moving a pin cylinder 116A. In some embodiments of the present invention, the pin cylinder 116A includes an air fitting and is pneumatically actuated. FIG. 3 depicts the pin management valve assembly 108 in the open valve configuration. The open pin management valve 300 has a sufficiently large diameter to allow a single pogo pin to pass through. In some embodiments of the present invention, the open pin management valve 300 has a substantially equal diameter as the nozzle assembly 106 tubing. FIG. 4 depicts the pin management valve assembly 108 in the partially closed valve configuration. The partially closed pin management valve 302 has a restricted diameter that is not sufficiently large enough to pass a single pogo pin through. In some embodiments of the present invention, the partially closed pin management valve 302 has a diameter that is 99, 98, 95, 90, 80, 60, 50, 25 percent the diameter of the nozzle assembly 106 tubing.

Figure 5:
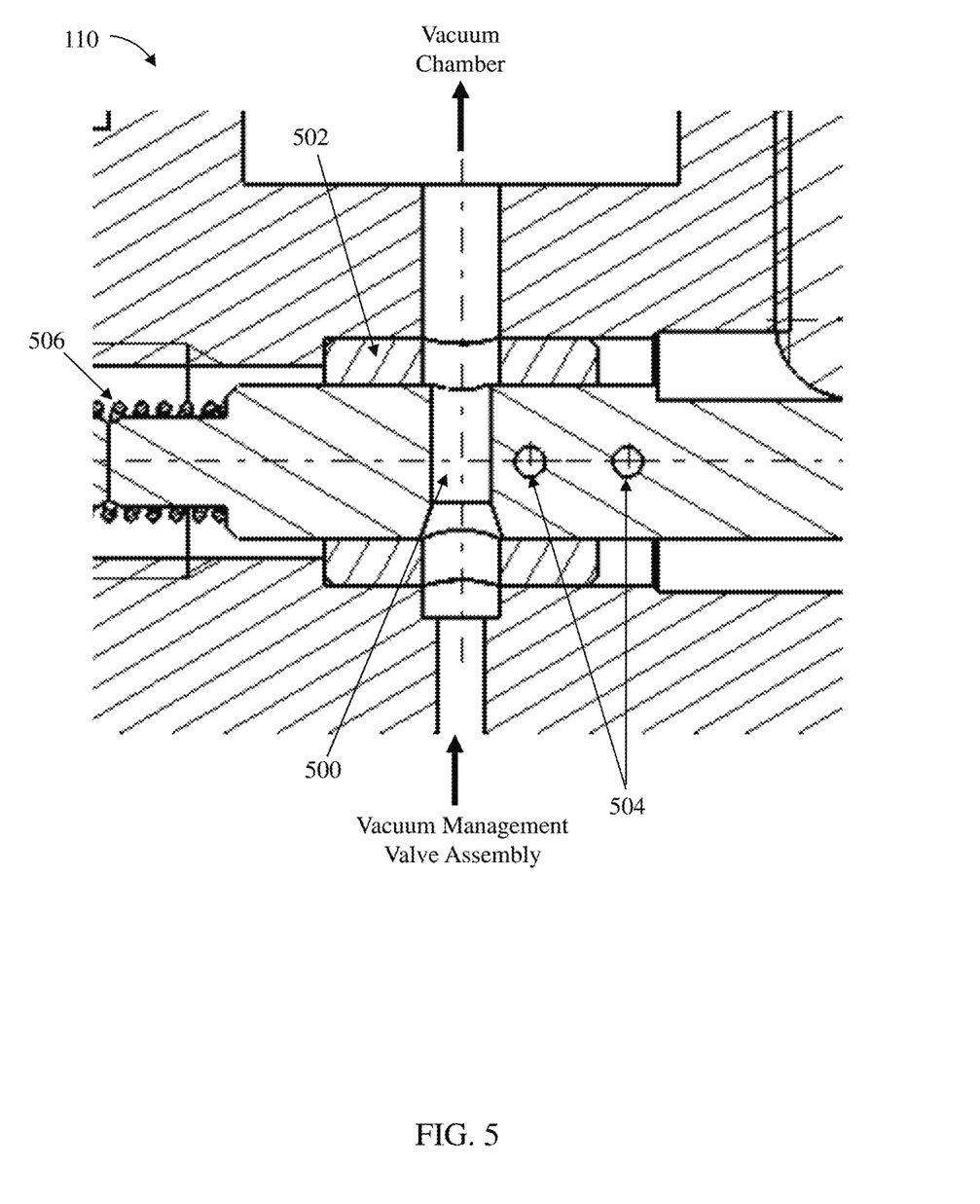
FIG. 5 depicts a blown-up cross-sectional view of a vacuum management valve assembly in an open position according to one or more embodiments of the invention.
Figure 6:
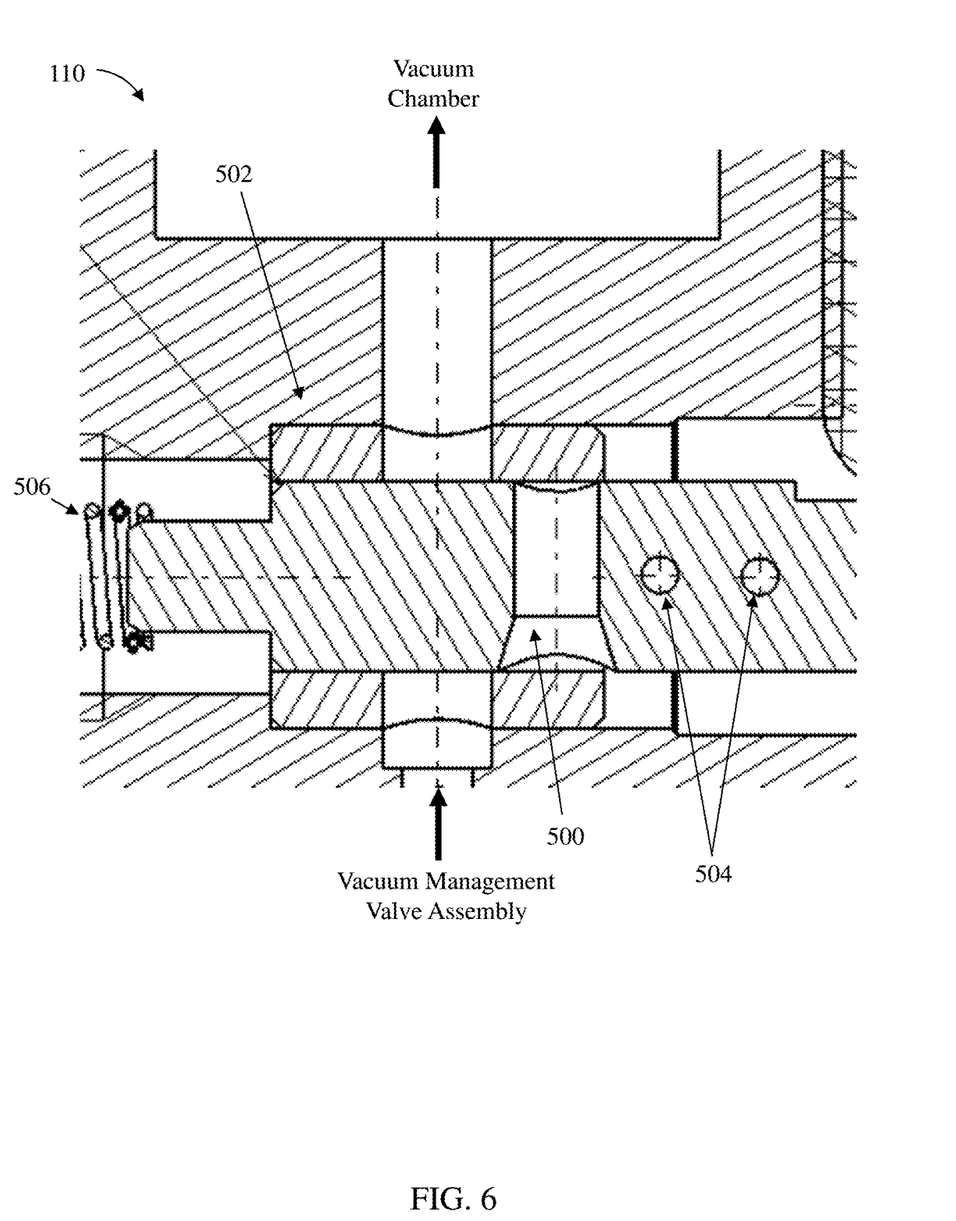
FIG. 6 depicts a blown-up cross-sectional view of the vacuum management valve assembly in a closed position according to one or more embodiments of the invention.

The pin management valve assembly 108 is coupled to the vacuum management valve assembly 110 such that the pogo pin 102 can pass through the pin management valve assembly 108 and into the vacuum management valve assembly 110. The vacuum management valve assembly 110 can be actuated between an open valve position and a closed valve position by moving a pin cylinder 116B. In some embodiments of the present invention, the pin cylinder 116B includes an air fitting and is pneumatically actuated. FIG. 5 depicts the vacuum management valve assembly 110 in the open valve configuration. The vacuum management valve 500 has a sufficiently large diameter to allow a single pogo pin to pass through. In some embodiments of the present invention, the vacuum management valve 500 has a substantially equal diameter as the nozzle assembly 106 tubing. FIG. 6 depicts the vacuum management valve assembly 110 in the closed valve configuration. The closed valve position prevents any pogo pins from passing through and decouples the nozzle assembly 106 tubing and pin management valve assembly 108 tubing from the vacuum reservoir 112.

The vacuum management valve assembly 110 is coupled to the vacuum reservoir 112 such that the pogo pin 102 can pass through the vacuum management valve assembly 110 and into the vacuum reservoir 112. The vacuum reservoir 112 is located within a vacuum housing 118. The vacuum reservoir 112 is under vacuum (also known as vacuum pressure). As used herein, vacuum pressure refers to an absolute gaseous pressure that is less than atmospheric pressure. For example, the absolute pressure can be about 0 pounds per square inch absolute (PSIA) to about 14.7 PSIA.

The vacuum housing 118 includes a reservoir suction pipe 120, a reservoir closing clip 122, a pin deflector 124, and a quick connect vacuum connector 126. The reservoir suction pipe 120 is positioned within the vacuum reservoir 112 such that a pogo pin passing through the reservoir suction pipe 120 will strike the pin deflector 124. The pin deflector 124 ensures that a pogo pin entering the vacuum reservoir 112 will not clog the reservoir suction pipe 120. The reservoir closing clip 122 can be opened when access to the vacuum reservoir 112 is required, such as during maintenance or inspection periods. The quick connect vacuum connector 126 allows for the vacuum reservoir 112 to be connected to an external source (not depicted) for re-depressurization. In this manner, the vacuum reservoir 112 can be put back into a vacuum state after prolonged periods of use. In some embodiments of the present invention, the vacuum reservoir 112 has a volume that is substantially greater (i.e., more than a factor of 5, 10, 20, 100 times larger) than the volume of the tool 100 tubing and nozzle tip. Consequently, the tool 100 can be operated for a long time with many pogo pins before requiring re-depressurization.

Figure 2:
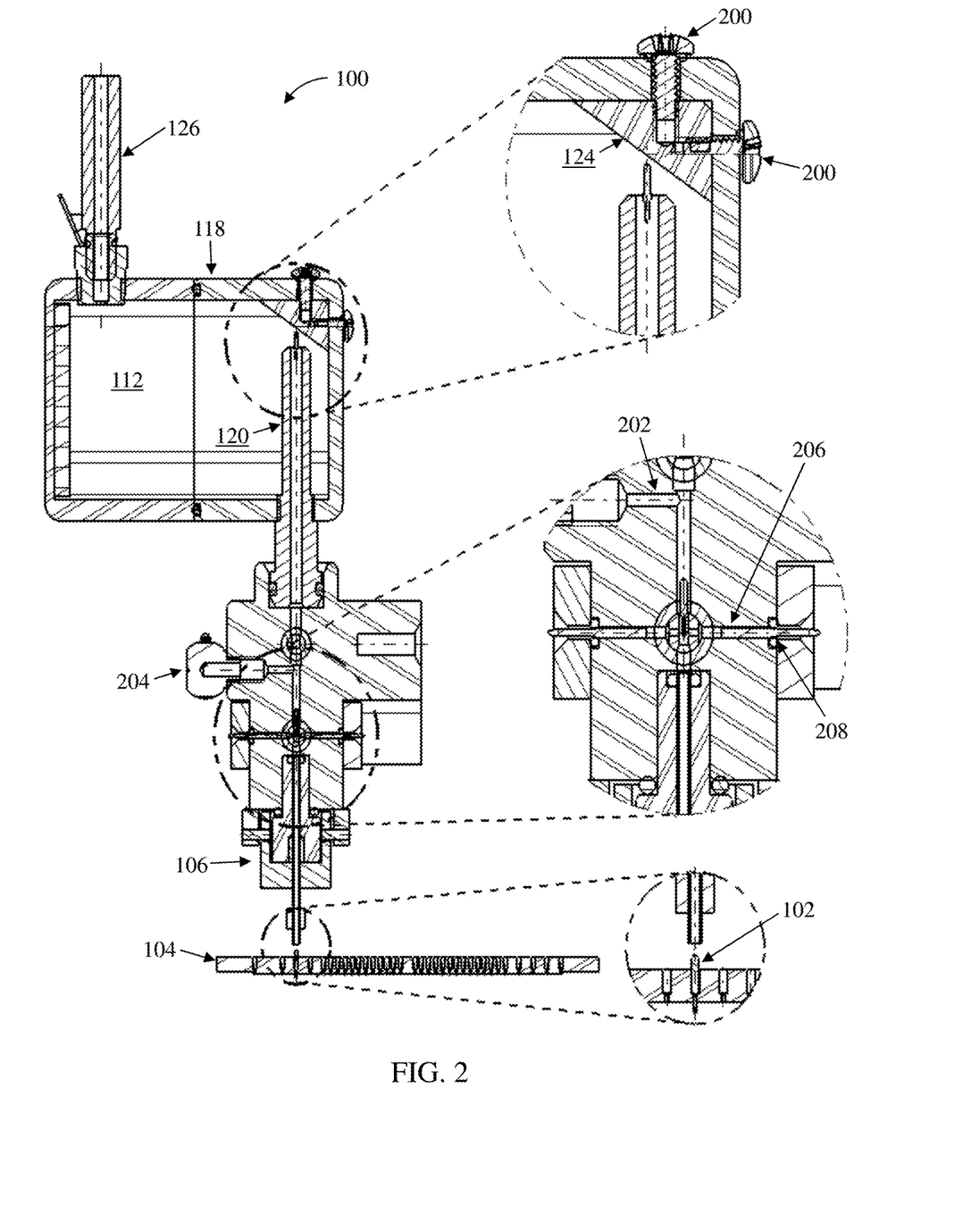
FIG. 2 depicts a cross-sectional view of the tool perpendicular to the cross-sectional view depicted in FIG. 1 according to one or more embodiments of the invention.

FIG. 2 depicts a cross-sectional view of the tool 100 perpendicular to the cross-sectional view depicted in FIG. 1 according to one or more embodiments of the invention. From this view, it is readily apparent that the vacuum reservoir 112 includes one or more deflector screws 200. The deflector screws 200 can be used to adjust or otherwise position the pin deflector 124 within the vacuum housing 118. The tool 100 also includes a blow off 202 located between the pin management valve assembly 108 and the vacuum management valve assembly 110. In some embodiments of the present invention, the blow off 202 extends in a direction orthogonal to the pin cylinders 116A and 116B. In some embodiments of the present invention, the blow off 202 extends in a direction parallel to the pin cylinders 116A and 116B (not depicted).

The blow off 202 is pressurized and can be actuated using an air fitting 204 to push the pogo pin 102 out of the pin management valve assembly 108 and nozzle assembly 106 and into a hole in the substrate 104. Prior to actuating the blow off 202, the vacuum management valve assembly 110 is actuated into the closed valve position by moving the pin cylinder 116B. As discussed previously herein, the closed valve position decouples the nozzle assembly 106 tubing and pin management valve assembly 108 tubing from the vacuum reservoir 112. As the vacuum path is closed, actuating the blow off 202 (i.e., pressurizing the tool 100 tubing) will force the pogo pin 102 out the tip of the nozzle assembly 106.

In some embodiments of the present invention, the tool 100 includes one or more sensors 206. The sensors 206 are positioned adjacent to the pin management valve assembly 108 and the vacuum management valve assembly 110. In some embodiments of the present invention, the sensors 206 include optical fibers coupled to fiber optic sensors. The sensors 206 are positioned to detect the current configuration of the pin management valve assembly 108 and the vacuum management valve assembly 110. In some embodiments of the present invention, the sensors 206 located adjacent to the pin management valve assembly 108 are located in the vacuum path and include one or more O-rings 208 to prevent vacuum leakage.

FIG. 3 depicts a blown-up cross-sectional view of the pin management valve assembly 108 according to one or more embodiments of the invention. The pin management valve assembly 108 includes an open pin management valve 300 and a partially closed pin management valve 302. The valves 300 and 302 are positioned within a valve sleeve 304. As discussed previously herein, the open pin management valve 300 and the partially closed pin management valve 302 are actuated using the pin cylinder 116A (depicted in FIG. 1). In some embodiments of the present invention, the pin cylinder 116A includes an air fitting and the valves 300 and 302 are pneumatically actuated. The pin management valve assembly 108 is actuated such that one of the open pin management valve 300 or the partially closed pin management valve 302 is coupled to the tool 100 tubing. As depicted, the pin management valve assembly 108 is actuated into the open position. In other words, the open pin management valve 300 is coupled to the tool 100 tubing. In this configuration, the pogo pin 102 can pass through the pin management valve assembly 108.

In some embodiments of the present invention, the pin management valve assembly 108 includes one or more valve return springs 306. The valve return springs 306 can be positioned such that the springs are compressed when the pin cylinder 116A is actuated. In this manner, shutting off the pin cylinder 116A will allow the valve return springs 306 and the valves 300 and 302 to return to their relaxed state. In some embodiments of the present invention, the valve return springs 306 are positioned such that the open pin management valve 300 is the relaxed (default) state. In some embodiments of the present invention, the valve return springs 306 are positioned such that the partially closed pin management valve 302 is the relaxed (default) state.

FIG. 4 depicts a blown-up cross-sectional view of the pin management valve assembly 108 according to one or more embodiments of the invention. As discussed previously herein, the pin management valve assembly 108 includes an open pin management valve 300 and a partially closed pin management valve 302. The valves 300 and 302 are positioned within a valve sleeve 304 and are actuated using the pin cylinder 116A (depicted in FIG. 1). In some embodiments of the present invention, the pin cylinder 116A includes an air fitting and the valves 300 and 302 are pneumatically actuated. The pin management valve assembly 108 is actuated such that one of the open pin management valve 300 or the partially closed pin management valve 302 is coupled to the tool 100 tubing. As depicted, the pin management valve assembly 108 is actuated into the partially closed position. In other words, the partially closed pin management valve 302 is coupled to the tool 100 tubing. In this configuration, the pin management valve assembly 108 allows for the vacuum reservoir 112 to provide vacuum pressure through the pin management valve assembly 108 (i.e., the tool 100 tubing is under vacuum) without allowing the pogo pin 102 to pass through.

FIG. 5 depicts a blown-up cross-sectional view of the vacuum management valve assembly 110 according to one or more embodiments of the invention. In some embodiments of the present invention, the vacuum management valve assembly 110 includes a vacuum management valve 500. The vacuum management valve 500 is positioned within a valve sleeve 502 and is actuated between open and closed positions using the pin cylinder 116B (depicted in FIG. 1). In some embodiments of the present invention, the pin cylinder 116B includes an air fitting and the vacuum management valve 500 is pneumatically actuated. Once actuated into the open or closed position, the vacuum management valve assembly 110 is locked into place by one or more vacuum valve position holes 504. As depicted, the vacuum management valve assembly 110 is actuated into the open position. In other words, the vacuum management valve 500 is coupled to the tool 100 tubing. In this configuration, the pogo pin 102 can pass through the vacuum management valve assembly 110.

In some embodiments of the present invention, the vacuum management valve assembly 110 includes one or more valve return springs 506. The valve return springs 506 can be positioned such that the springs are compressed when the pin cylinder 116B is actuated. In this manner, shutting off the pin cylinder 116B will allow the valve return springs 506 and the vacuum management valve 500 to return to their relaxed state. In some embodiments of the present invention, the valve return springs 506 are positioned such that the vacuum management valve 500 is in the relaxed (default) state while in the open position. In some embodiments of the present invention, the valve return springs 506 are positioned such that the vacuum management valve 500 is the relaxed (default) state while in the closed position.

FIG. 6 depicts a blown-up cross-sectional view of the vacuum management valve assembly 110 according to one or more embodiments of the invention. As discussed previously herein, the vacuum management valve assembly 110 includes a vacuum management valve 500 positioned within a valve sleeve 502. The vacuum management valve assembly 110 is actuated between open and closed positions using the pin cylinder 116B (depicted in FIG. 1). In some embodiments of the present invention, the pin cylinder 116B includes an air fitting and the vacuum management valve 500 is pneumatically actuated. The vacuum management valve assembly 110 is actuated such that one of the open pin management valve 300 or the partially closed pin management valve 302 is coupled to the tool 100 tubing. As depicted, the vacuum management valve assembly 110 is actuated into the closed position. In other words, the vacuum management valve 500 is decoupled from the tool 100 tubing. In this configuration, the tool 100 tubing is not under vacuum pressure and the pogo pin 102 cannot pass through.

Figure 7:
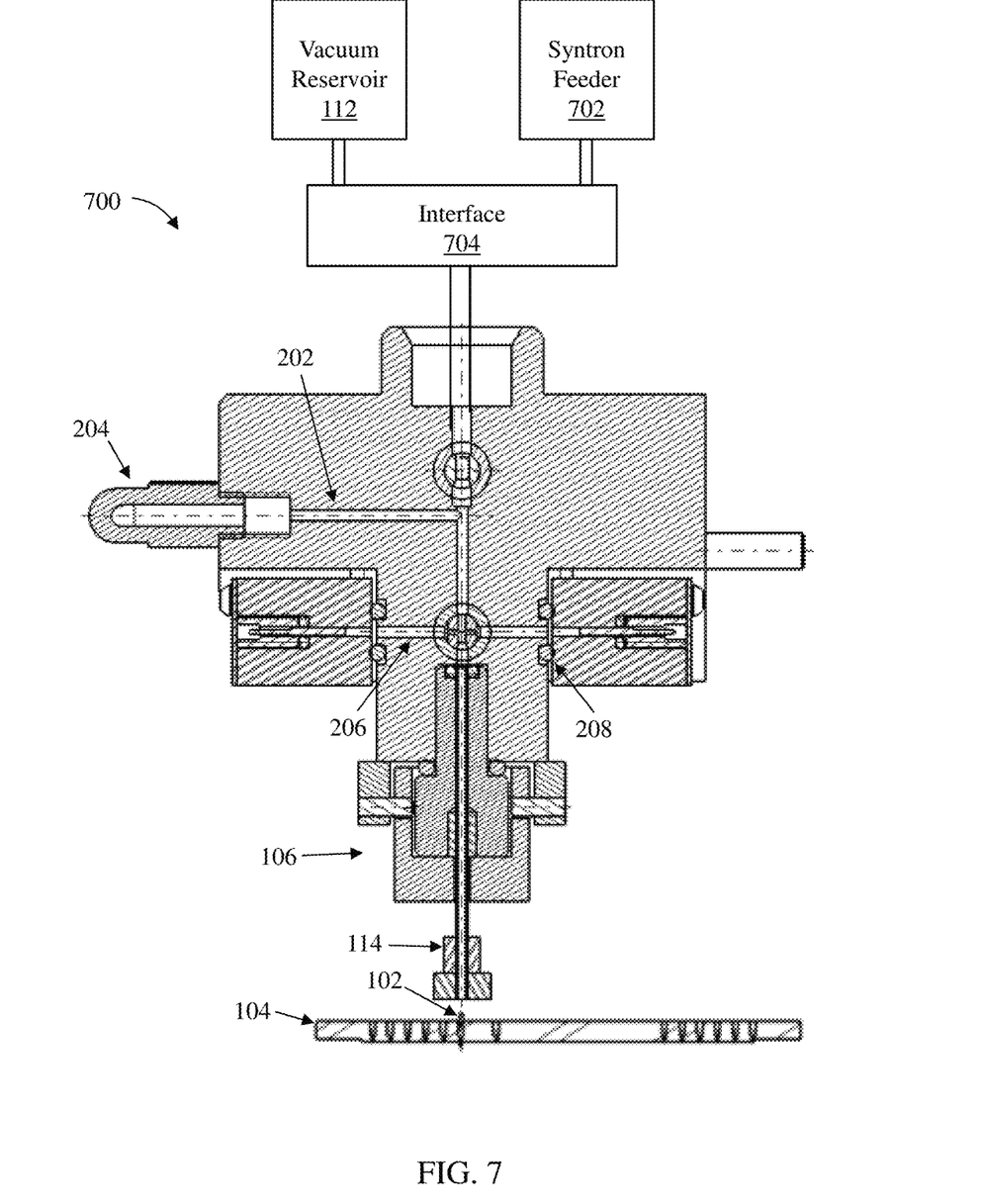
FIG. 7 depicts a cross-sectional view of a tool for manipulating pogo pins in a substrate according to one or more embodiments of the invention.

FIG. 7 depicts a cross-sectional view of a tool 700 for manipulating the pogo pin 102 in the substrate 104 according to one or more embodiments of the invention. The tool 700 is an alternative version of the tool 100 depicted in FIG. 1. In some embodiments of the present invention, the tool 700 includes a syntron feeder 702 coupled to the tool 700 tubing using an interface 704. The syntron feeder 702 stores, orients and feeds new pogo pins through the interface 704 and into the tool 700 tubing. The syntron feeder 702 includes a manipulation head and an internal bank for storing and orienting the pogo pins (not depicted). The syntron feeder 702 can be sized to store any number of pogo pins, depending on the application requirements. In some embodiments of the present invention, the syntron feeder 702 stores hundreds of pogo pins. In some embodiments of the present invention, the syntron feeder 702 is itself coupled to an external pogo pins bank (not depicted) and is continuously or periodically refilled with pogo pins. The addition of the syntron feeder 702 to the tool 700 is particularly advantageous when greater tool capacity is required or when the pogo pins supplier is not able to provide pogo pins vertically in a bank or interposer. While more efficient, this configuration is more expensive, as a unique syntron system is required for each pogo pin type. In some embodiments of the present invention, the interface 704 is coupled to both the vacuum reservoir 112 and the syntron feeder 702 and can be switched between a feeding operating mode (i.e., the syntron feeder 702 is coupled to the tool 700 tubing) and a removing operating mode (i.e., the vacuum reservoir 112 is coupled to the tool 700 tubing).

Figure 8:
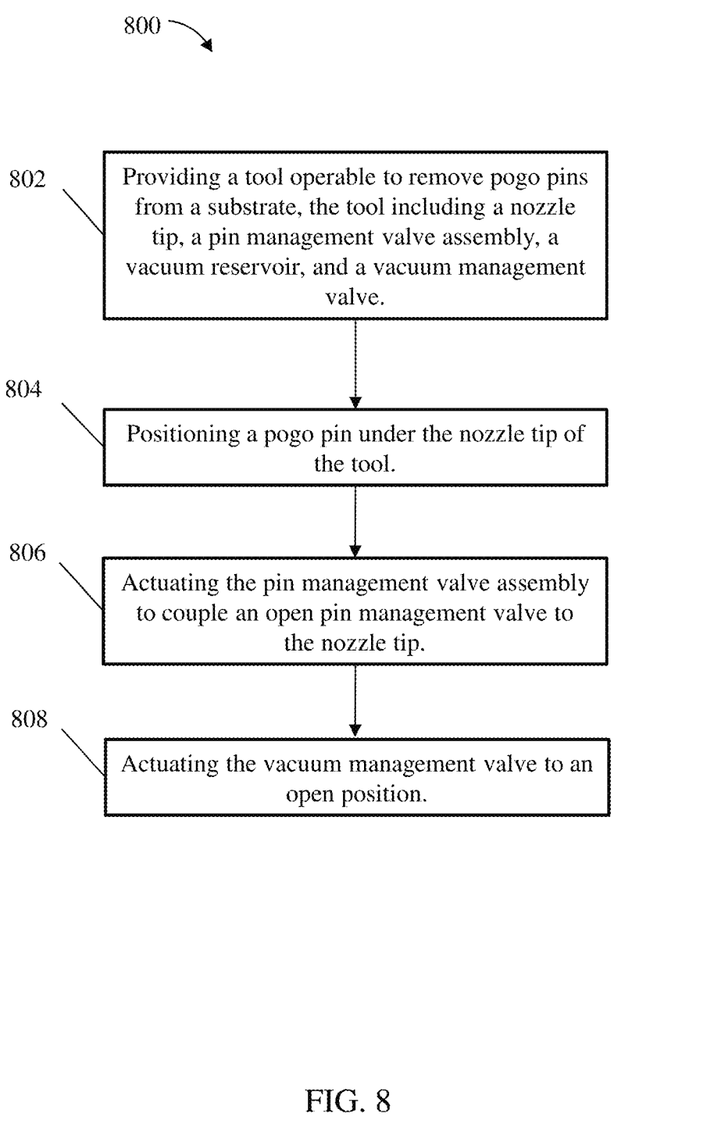
FIG. 8 depicts a flow diagram of a method for removing pogo pins from a substrate according to one or more embodiments of the invention.

FIG. 8 depicts a flow diagram of a method for removing pogo pins from a substrate according to one or more embodiments of the invention. The method 800 includes providing, at block 802, a tool operable to remove pogo pins from a substrate. The tool can be the same as the tool 100 (depicted in FIG. 1) and the tool 700 (depicted in FIG. 7) as described previously herein. The tool can include a nozzle tip and a pin management valve assembly 108 coupled to the nozzle tip. As described previously herein, the pin management valve assembly 108 is actuatable to couple an open pin management valve 300 or a partially closed pin management valve 302 to the nozzle tip. The open pin management valve 300 includes a first diameter which is sufficient to allow a pogo pin to pass through. The partially closed pin management valve 302 includes a second diameter that is not sufficient to allow a pogo pin to pass through. The tool also includes a vacuum reservoir 112 coupled to the pin management valve assembly 108 and a vacuum management valve assembly 110 located between the pin management valve assembly 108 and the vacuum reservoir 112. As discussed previously herein, the vacuum management valve assembly 110 includes a vacuum management valve 500 that is actuatable between an open and closed position.

At block 804, the method 800 includes positioning a pogo pin under the nozzle tip. In some embodiments of the present invention, the substrate is partitioned into x and y coordinates. In this manner, the substrate can be automatically repositioned to the x and y coordinates of a given pogo pin.

The method 800, at block 806, includes actuating the pin management valve assembly 108 to couple the open pin management valve 300 to the nozzle tip. In some embodiments of the present invention, the tool includes one or more sensors 206 positioned adjacent to the pin management valve assembly 108 for automatically detecting the current configuration of the pin management valve assembly 108. In some embodiments of the present invention, the sensors 206 include optical fibers coupled to fiber optic sensors.

At block 808, the vacuum management valve 500 is actuated to the open position. In some embodiments of the present invention, the tool includes one or more sensors 206 positioned adjacent to the vacuum management valve assembly 110 for automatically detecting the current configuration of the vacuum management valve 500. In some embodiments of the present invention, the sensors 206 include optical fibers coupled to fiber optic sensors. Once the vacuum management valve 500 is actuated to the open position, the nozzle tip will be under vacuum pressure and the pogo pin will be pulled into the vacuum reservoir 112. In some embodiments of the present invention, a high speed sensor (not depicted) is positioned over the substrate to automatically detect the successful removal of the pogo pin.

Figure 9:
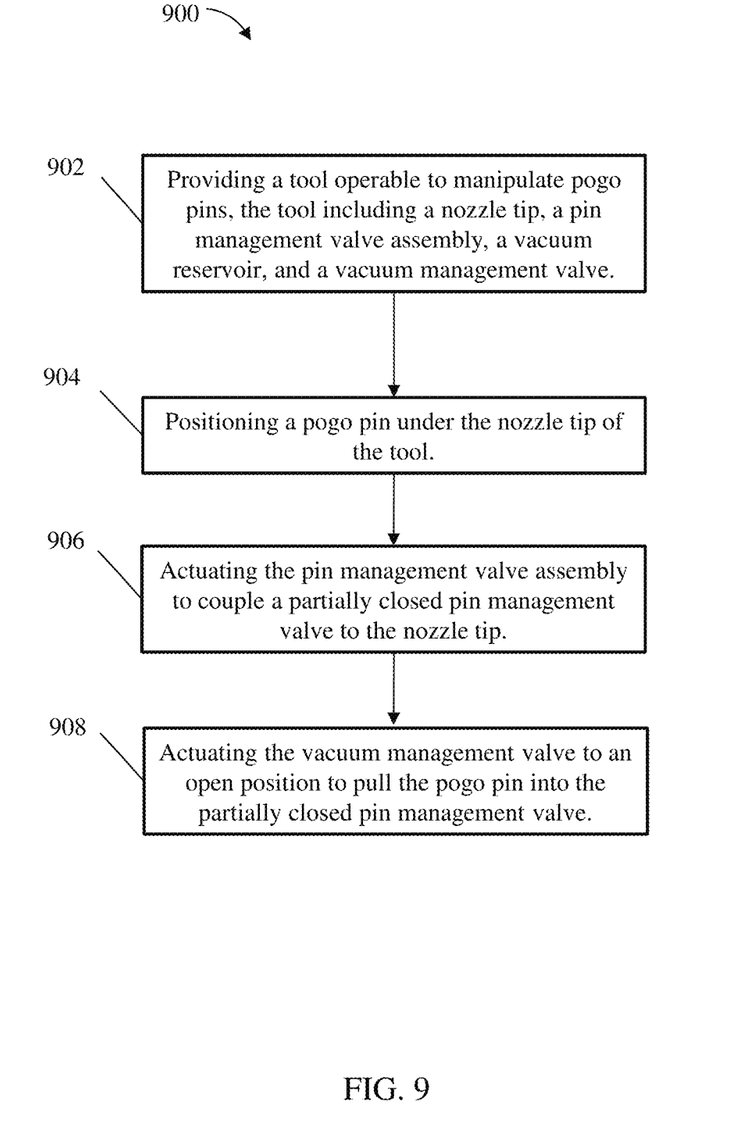
FIG. 9 depicts a flow diagram of a method for manipulating pogo pins according to one or more embodiments of the invention.

FIG. 9 depicts a flow diagram of a method for manipulating pogo pins according to one or more embodiments of the invention. The method 900 includes providing, at block 902, a tool operable to pick up new pogo pins from a container (also known as a bank) and place those new pogo pins into a substrate. The tool can be the same as the tool 100 (depicted in FIG. 1) and the tool 700 (depicted in FIG. 7) as described previously herein. The tool can include a nozzle tip and a pin management valve assembly 108 coupled to the nozzle tip. As described previously herein, the pin management valve assembly 108 is actuatable to couple an open pin management valve 300 or a partially closed pin management valve 302 to the nozzle tip. The open pin management valve 300 includes a first diameter which is sufficient to allow a pogo pin to pass through. The partially closed pin management valve 302 includes a second diameter that is not sufficient to allow a pogo pin to pass through. The tool also includes a vacuum reservoir 112 coupled to the pin management valve assembly 108 and a vacuum management valve assembly 110 located between the pin management valve assembly 108 and the vacuum reservoir 112. As discussed previously herein, the vacuum management valve assembly 110 includes a vacuum management valve 500 that is actuatable between an open and closed position.

At block 904, the method 900 includes positioning a pogo pin under the nozzle tip. In some embodiments of the present invention, the pogo pin bank is partitioned into x and y coordinates. In this manner, the bank can be automatically repositioned to the x and y coordinates of the next pogo pin.

The method 900, at block 906, includes actuating the pin management valve assembly 108 to couple the partially closed pin management valve 302 to the nozzle tip. In some embodiments of the present invention, the tool includes one or more sensors 206 positioned adjacent to the pin management valve assembly 108 for automatically detecting the current configuration of the pin management valve assembly 108. In some embodiments of the present invention, the sensors 206 include optical fibers coupled to fiber optic sensors.

At block 908, the vacuum management valve 500 is actuated to the open position. In some embodiments of the present invention, the tool includes one or more sensors 206 positioned adjacent to the vacuum management valve assembly 110 for automatically detecting the current configuration of the vacuum management valve 500. In some embodiments of the present invention, the sensors 206 include optical fibers coupled to fiber optic sensors. Once the vacuum management valve 500 is actuated to the open position, the nozzle tip will be under vacuum pressure and the pogo pin will be pulled into the partially closed pin management valve 302. In some embodiments of the present invention, a high speed sensor (not depicted) is positioned over the bank to automatically detect the successful removal of the pogo pin.

Once the pogo pin is successful trapped in the partially closed pin management valve 302, the tool can be positioned over a hole in the substrate. To release the pogo pin the vacuum management valve 500 is actuated into the closed position, cutting off the vacuum pressure at the nozzle tip. After vacuum pressure is shut off, a blow-off is actuated to push the pogo pin out of the partially closed pin management valve 302, through the nozzle tip, and into the pogo pin hole in the substrate. The blow off can be the same as the blow off 202 (depicted in FIG. 2) as described previously herein. Once the new pogo pin is successfully inserted into the substrate a new pogo pin can be loaded and the process repeated.

Additional processes may also be included. It should be understood that the processes depicted in FIGS. 8 and 9 represent illustrations and that other processes may be added or existing processes may be removed, modified, or rearranged without departing from the scope and spirit of the present disclosure.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An apparatus for manipulating pins, the apparatus comprising:
    a nozzle tip;
    a pin management valve assembly coupled to the nozzle tip, the pin management valve assembly actuatable to couple an open pin management valve or a partially closed pin management valve to the nozzle tip, the open pin management valve comprising a first diameter and the partially closed pin management valve comprising a second diameter;
    a vacuum reservoir coupled to the pin management valve assembly; and
    a vacuum management valve between the pin management valve assembly and the vacuum reservoir, the vacuum management valve actuatable between an open and closed position;
    wherein the first diameter is larger than a diameter of a pin and the second diameter is smaller than a diameter of the pin.

2. The apparatus of claim 1 further comprising a pin cylinder coupled to the pin management valve assembly.

3. The apparatus of claim 2, wherein actuating the pin management valve assembly comprises moving the pin cylinder.

4. The apparatus of claim 2, wherein the pin cylinder comprises an air fitting and is pneumatically actuated.

5. The apparatus of claim 1 further comprising a pin cylinder coupled to the vacuum management valve.

6. The apparatus of claim 5, wherein actuating the vacuum management valve comprises moving the pin cylinder.

7. The apparatus of claim 5, wherein the pin cylinder comprises an air fitting and is pneumatically actuated.

8. The apparatus of claim 1 further comprising a blow off positioned between the vacuum management valve and the pin management valve assembly.

9. The apparatus of claim 8, wherein the blow off is pressurized and can be actuated using an air fitting to push a pin out of the pin management valve assembly and the nozzle tip.

10. An apparatus for manipulating pins, the apparatus comprising:
 a nozzle tip;
 a pin management valve assembly coupled to the nozzle tip, the pin management valve assembly actuatable to couple an open pin management valve or a partially closed pin management valve to the nozzle tip, the open pin management valve comprising a first diameter and the partially closed pin management valve comprising a second diameter;
 a pin cylinder coupled to the pin management valve assembly;
 a vacuum reservoir coupled to the pin management valve assembly; and
 a vacuum management valve between the pin management valve assembly and the vacuum reservoir, the vacuum management valve actuatable between an open and closed position.

11. The apparatus of claim 10, wherein actuating the pin management valve assembly comprises moving the pin cylinder.

12. The apparatus of claim 10, wherein the pin cylinder comprises an air fitting and is pneumatically actuated.

13. An apparatus for manipulating pins, the apparatus comprising:
 a nozzle tip;
 a pin management valve assembly coupled to the nozzle tip, the pin management valve assembly actuatable to couple an open pin management valve or a partially closed pin management valve to the nozzle tip, the open pin management valve comprising a first diameter and the partially closed pin management valve comprising a second diameter;
 a vacuum reservoir coupled to the pin management valve assembly;
 a vacuum management valve between the pin management valve assembly and the vacuum reservoir, the vacuum management valve actuatable between an open and closed position; and
 a pin cylinder coupled to the vacuum management valve.

14. The apparatus of claim 13, wherein actuating the vacuum management valve comprises moving the pin cylinder.

15. The apparatus of claim 13, wherein the pin cylinder comprises an air fitting and is pneumatically actuated.

16. The apparatus of claim 13 further comprising a blow off positioned between the vacuum management valve and the pin management valve assembly.

17. The apparatus of claim 16, wherein the blow off is pressurized and can be actuated using an air fitting to push a pin out of the pin management valve assembly and the nozzle tip.

* * * * *